United States Patent [19]
Tang et al.

[11] Patent Number: 5,904,961
[45] Date of Patent: *May 18, 1999

[54] METHOD OF DEPOSITING ORGANIC LAYERS IN ORGANIC LIGHT EMITTING DEVICES

[75] Inventors: Ching W. Tang; Joseph K. Madathil, both of Rochester; Dustin L. Comfort, Webster, all of N.Y.

[73] Assignee: Eastman Kodak Company, Rochester, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/788,537

[22] Filed: Jan. 24, 1997

[51] Int. Cl.$^6$ .................................. B05D 5/12; B05D 3/00
[52] U.S. Cl. ...................... 427/561; 427/585; 427/596; 427/66; 427/69; 427/146
[58] Field of Search ...................... 427/146, 148, 427/561, 596, 585, 64, 1, 70; 313/483; 345/76

[56] References Cited

U.S. PATENT DOCUMENTS

| | | |
|---|---|---|
| 3,978,247 | 8/1976 | Braudy et al. .............................. 427/43 |
| 4,356,429 | 10/1982 | Tang . |
| 4,539,507 | 9/1985 | VanSlyke et al. . |
| 4,720,432 | 1/1988 | VanSlyke et al. . |
| 4,743,463 | 5/1988 | Ronn et al. .............................. 427/53.1 |
| 4,769,292 | 9/1988 | Tang et al. . |
| 4,885,211 | 12/1989 | Tang et al. . |
| 5,047,687 | 9/1991 | VanSlyke . |
| 5,059,861 | 10/1991 | Littman et al. . |
| 5,059,862 | 10/1991 | VanSlyke et al. . |
| 5,061,617 | 10/1991 | Maskasky . |
| 5,065,697 | 11/1991 | Yoshida et al. .......................... 118/719 |
| 5,294,870 | 3/1994 | Tang et al. .............................. 313/504 |

FOREIGN PATENT DOCUMENTS 2113336  9/1971  Germany .

Primary Examiner—Brian K. Talbot
Attorney, Agent, or Firm—Raymond L. Owens

[57] ABSTRACT

A method of depositing organic layers on a substrate in organic light emitting devices is disclosed. The method uses a donor support which is coated with a transferable coating of an organic donor material selected as one of a plurality of organic materials useful in an organic light emitting device. The donor coating is positioned in transferable relationship with the substrate in an environment of reduced pressure. The donor support is heated to cause the transferable coating of organic donor material to transfer to a position on or over the substrate and to form a layer of the organic material on the substrate.

13 Claims, 3 Drawing Sheets

METHOD OF DEPOSITING ORGANIC LAYERS IN ORGANIC LIGHT EMITTING DEVICES

CROSS REFERENCE TO RELATED APPLICATIONS

The present invention is related to commonly-assigned U.S. patent application Ser. No. 08/648,772 filed May 16, 1996 and entitled "Method of Forming an Organic Electroluminescent Display Panel" by Littman et al now abandoned; commonly-assigned U.S patent application Ser. No. 08/789,590 filed concurrently herewith now U.S. Pat. No. 5,756,240, and entitled "Method of Making Color Filter Arrays by Transferring Colorant Material" by Roberts et al; commonly assigned U.S. patent application Ser. No. 08/788,532 filed concurrently herewith now U.S. Pat. No. 5,811,156, and entitled "Method of Making Color Filter Arrays by Colorant Transfer and Etch" by L. C. Roberts; commonly-assigned U.S patent application Ser. No. 08/788,108 filed concurrently herewith now U.S. Pat. No. 5,747,199, and entitled "Method of Making Color Filter Arrays by Transferring Two or More Colorants Simultaneously" by Roberts et al; and commonly-assigned U.S. patent application Ser. No. 08/787,732, filed concurrently herewith now U.S. Pat. No. 5,776,641, and entitled "Method of Making Color Filter Arrays by Colorant Transfer Using Chemical Mechanical Polishing" by Roberts et al, the disclosures of which are incorporated herein by reference.

FIELD OF THE INVENTION

The present invention relates to methods of making organic light emitting devices.

BACKGROUND OF THE INVENTION

For the fabrication of organic, light-emitting devices (also referred to as electroluminescent devices and, in abbreviation, as EL devices), it is important that the thin film preparation method is scaleable to substrates of various sizes and particularly to large area substrates for economic reasons. Among various fabrication methods, physical vapor deposition has been widely used because it is relatively simple and is capable of producing highly efficient devices.

Turning to FIG. 1, which shows a schematic view of a prior art method of making organic layers for organic light emitting devices. A substrate 10 which is to receive an organic layer, is positioned adjacent to an aperture mask 12. The aperture mask 12 provides an aperture shown as a dimension A over a portion of the substrate 10. An organic material 3 which is to provide a layer on or over the substrate, is disposed in a source crucible 4 which is heated by suitable arrangements such as shown heating coils 5. When heat is applied to the crucible 4, the organic material vaporizes in a reduced pressure environment, such as in a reduced pressure chamber 1 having a pump port 2. The vapor emanates from the crucible 4 as schematically indicated by the dotted vapor arrows 3$v$ and condenses as a deposited layer 3$d$, also depicted in dotted outline, on portions of the chamber 1, the underside of the aperture mask 12, on the substrate 10 through the aperture A in mask 12, on the underside of a shutter blade 7 and associated shutter shaft 8, as well as on the surfaces of deposition monitors 9$a$ and 9$b$.

In order to fabricate highly efficient organic light mitting devices it is preferred to sequentially deposit on the substrate 10 a plurality of relatively thin (approximately 100–500 Å) organic layers of different organic materials, as will be detailed below. Prior to forming each of these layers on the substrate, the shutter shaft 8 is rotated such that the shutter blade 7 is positioned to shield the substrate 10 until such time as is needed to initiate and stabilize the vaporizing of an organic material 3 from the source crucible 4, measured by the deposition monitors 9$a$, 9$b$. During this start-up and stabilizing period, the above-mentioned layers 3$d$ of organic material are formed within portions of the chamber 1, but not on the substrate. Upon opening the shutter blade 7 to the position shown in FIG. 1, an organic layer 3$d$ is formed on the substrate, and the layers elsewhere in the chamber keep growing in thickness. Such growth of layer thickness within the portions of the chamber and its associated parts can lead to cracking, flaking or dusting of these layers during cycles of pressure reduction (pump-down) and pressure increase (venting) of the chamber and during rotation of the shutter between open and closed positions.

It will be appreciated that the generation of these undesirable particulates reduces the yield of devices having consistent quality. Frequent cleaning of the chamber and associated parts can overcome the yield concern, but at the cost of reduced throughput of fabricated devices.

Another disadvantage of this prior art method of depositing organic layers in organic light emitting devices is relatively poor utilization of the organic material 3 in the source crucible 4, i.e., as little as approximately 10–20% of organic material 3 may be utilized to form a layer 3$d$ on the substrate 10, with 80–90% of the material forming undesirable layers elsewhere in the chamber. Since the fabrication of highly efficient organic light emitting devices calls for purified, and therefore relatively expensive, organic materials, poor material utilization is clearly undesirable.

The aforementioned significant disadvantages are magnified when contemplating the fabrication of organic EL devices over relatively large area substrates, for example over substrates as large as 30 cm by 30 cm.

SUMMARY OF THE INVENTION

It is an object of the present invention to provide an improved method of making organic light emitting devices which obviates the above difficulties, provides uniform organic layers over the emitting area of such devices, and provides low cost and high quality light emitting devices.

This object is achieved by a method of making an organic light emitting device on a substrate which has a plurality of organic layers, the improvement wherein at least one of the layers is formed by the steps comprising:

a) providing a transferable coating of organic material on a donor support;

b) positioning the donor support in transferable relationship with the substrate in an environment of reduced pressure; and c) heating the donor support to cause the organic material to transfer to a position on or over the substrate, whereby a layer of organic material is formed on the substrate.

Advantages

Advantages of this technique are: excellent utilization of the transferable organic material; excellent uniformity of the layer over a large area; precise control of the layer thickness; conformal deposition; high deposition rate; reduced time at the transfer temperature of the transferable material; compact reduced pressure system for large area deposition;

lower maintenance deposition chamber; capability of multilayer deposition from a single donor support source; scalability to large-area deposition; continuous feed of transferable material; and minimal control for a deposition process that does not require deposition monitoring or a complex shutter arrangement.

Briefly described, the present invention discloses a simple vapor deposition method for the production of thin organic layers on a flat substrate with excellent uniformity. A feature of this method is to provide a coating of an organic material on a donor support as the physical vapor deposition source. By positioning the support and the substrate in transferable relationship, the organic material previously coated on the support is thermally transferred from the donor support to form a uniform layer on or over the substrate. The thickness and uniformity of the deposited layer is therefore determined by the donor coating on the donor support and the degree of transfer of the donor from the support to the substrate.

In practice, the donor support is first provided with a transferable coating of an organic donor material thereon by a suitable process. Examples of suitable methods for coating the support include solution coating, meniscus coating, dip coating, spraying, screen printing, and roll-to-roll-coating in a vacuum chamber. These methods are specifically designed to produce a uniform coating of a precise thickness on a donor support which may be a sheet, a foil or a flexible web. Using any one of these methods, a support coated with a predetermined thickness of the desired transferable organic donor material can be readily prepared in large quantity. For organic light emitting devices, a preferred method for the preparation of a donor coating on a flexible donor web support is the roll-to-roll vacuum coating because the coating thickness and uniformly on the web can be precisely controlled with an accuracy of better than a few percent.

When desired, an aperture mask is positioned adjacent to the substrate on which a layer is to be formed. The aperture mask is oriented with respect to features or orientation marks on the substrate. The donor support is positioned in a transferable relationship with the substrate. The transfer of the organic donor material from the coating on the donor support to the substrate is then carried out by a thermal process in which the organic material is transferred in an environment of reduced pressure to form a layer of organic material on the substrate.

It will be understood that the drawings are not to scale and have been shown for clarity of illustration.

DETAILED DESCRIPTION OF THE PREFERRED EMBODIMENTS

Figure 2A:
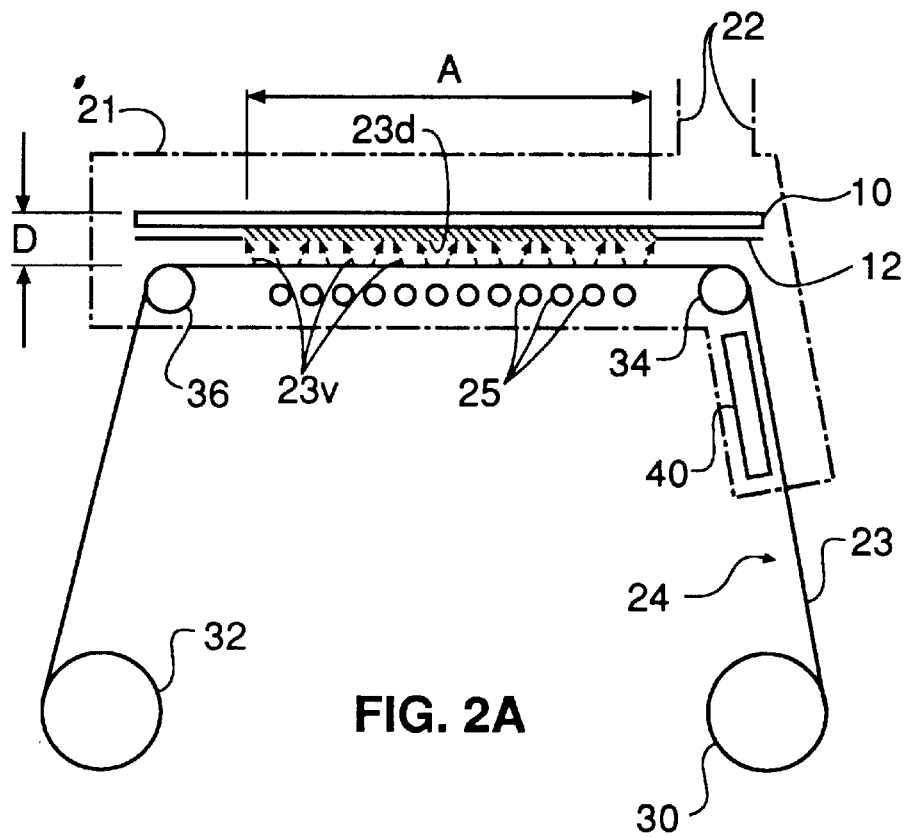
FIG. 2A shows, in schematic form, an arrangement for depositing organic layers in light emitting devices by radiant heating of a donor support in accordance with the present invention.

Turning now to FIG. 2A, which shows a specific arrangement for practice of the method in accordance with the present invention. There are provided a donor supply roll 30 and a donor return roll 32 which carry a flexible donor support 24 having a donor coating 23 of organic material. The donor support 24 is advanced from the supply roll 30 and is driven over a spindle 34 and another spindle 36 to the donor return roll 32. In a position between the spindles 34 and 36 is where the coating of organic donor material 23 is transferred from the support 24 to a light emitting device substrate 10. The light emitting device substrate 10 can have suitably patterned electrically conductive regions (not shown) and previously formed organic layers (not shown) on and over the surface facing the donor coating 23. If desired, an aperture mask 12 depicted here with an aperture dimension A, is positioned adjacent to the substrate surface and provided with features or orientation marks (not shown) for alignment registration on the substrate. The aperture mask 12 may have a plurality of apertures, each of which serves to delineate an area on the substrate where an organic layer is to be formed. When an unused portion of the donor coating 23 is positioned approximately between the spindles 34 and 36, and is spaced from the substrate by a distance D, the donor coating is in a transferable relationship with the substrate. Heating elements 25 are provided on the backside of the donor support at the donor transfer position.

The substrate, aperture mask, donor coating and donor support, the spindles, the heating elements, and a heating station 40 are shown as being enclosed within a reduced pressure chamber 21 having a pump port 22.

Prior to actuating the heating elements 25, the chamber 21 is provided with an environment of reduced pressure by partial evacuation via the pump port 22. Alternatively, the entire arrangement depicted in FIG. 2A can be placed in a reduced pressure environment. Upon actuating these heating elements, the organic material of the donor coating 23 on the donor support 24 is heated to a sufficient temperature to vaporize as donor vapor 23v and to transfer to form a uniform deposited layer 23d on or over the substrate 10 in areas delineated by the aperture mask 12. The transfer is schematically indicated by a plurality of dotted arrows 23v, and the layer 23d is also depicted in dotted outline.

In a preferred arrangement, a heating station 40 is provided to preheat the donor support 24 prior to its being moved to its transfer position to eliminate volatile contaminants such as water vapor from the donor coating 23.

The door support 24 with donor coating 23 thereon enters and leaves the reduced pressure chamber 21 through suitably designed ports (not shown) which are well known to vacuum technologists. Likewise, the aperture mask 12 is inserted or exchanged through a port of this type.

It will be appreciated that, in forming an organic layer having a dimension A, the spacing D between the transferable donor coating 23 on the donor support 24 and the substrate 10 is significantly smaller than the spacing B between the source crucible 14 and the substrate 10 of the prior art method (see FIG. 1) of making organic layers for organic light emitting devices. In addition to the aforementioned advantages of the present invention, the smaller spacing D makes it possible to transfer the transferable coating of organic donor material from the donor support and to form an organic layer on the substrate in an environment of reduced pressure, with the reduced pressure being related to the spacing D through the mean free path of the organic vapor molecules in a gaseous environment. Stated differently, the pressure in the environment of the present invention needs to be reduced just sufficiently from atmospheric pressure to ensure that the mean free path of vapor molecules of the organic materials transferred from the donor coating 23 is at least equal to the spacing dimension D if minimal scattering of vapor molecules is desired. By contrast, the pressure in the environment of the prior art method has to be reduced to a significantly lower value to ensure a mean free path of at least equal to the dimension B. In the practice of the present invention, the environment of reduced pressure is preferably at a pressure value of less than 0.01 Torr during the heating step so that the organic material transferred from the donor support forms a uniform organic layer on the substrate at a spacing D ranging from about 2 cm to about 0.2 cm. If an increased degree of scattering of organic donor vapor molecules by residual gases in the chamber can be tolerated, then the pressure during the heating step can be increased to a value of less than 1 Torr.

The donor support 24 can be made of any of several materials which meet at least the following requirements: The donor support must be sufficiently flexible and possess adequate tensile strength to tolerate precoating steps and roll-to-roll transport of the support in the practice of the invention. The donor support must be capable of maintaining the structural integrity during the heat-induced transfer step and during any preheating steps contemplated to remove volatile constituents such as water vapor. Additionally, the donor support must be capable of receiving on one surface a relatively thin coating of organic donor material, and of retaining this coating without degradation during anticipated storage periods of the coated support. Support materials meeting these requirements include, for example, metal foils, certain plastic foils which exhibit a glass transition temperature value higher than a support temperature value anticipated to cause transfer of the transferable organic donor materials of the coating on the support, and fiber-reinforced plastic foils. While selection of suitable support materials can rely on known engineering approaches, it will be appreciated that certain aspects of a selected support material merit further consideration when configured as a donor support useful in the practice of the invention. For example, the support may require a multi-step cleaning and surface preparation process prior to precoating with transferable organic material. If the support material is a radiation transmissive material, the incorporation into the support or onto a surface thereof opposing the surface to receive the donor coating, of a radiation-absorptive material may be advantageous to more effectively heat the donor support and to provide a correspondingly enhanced transfer of transferable organic donor material from the support to the substrate, if the heating step contemplates using a flash of radiation from a suitable flash lamp.

Heating the donor support to cause the organic donor material to transfer to the substrate can be performed by one of several methods known to those skilled in this art. For example, the flash-induced heating method mentioned above with reference to a radiation transmissive support can also be tailored to be effective on opaque supports such as metal foil supports. Particular surface preparation of the support surface receiving the radiation flash are known to enhance the radiation absorptive properties of a metal foil. A metal foil donor support can, of course, be heated by suitably arranged rod-type or coil-type heating elements 25 as schematically indicated in FIG. 2A. In contrast to the aforementioned heating methods using stationary or fixed heating elements or a stationary flash lamp, the transfer of the organic donor material 23 from the donor support 24 to the substrate 10 can be caused by translating or scanning a heat source in proximity to and along the support surface to be heated, for example scanning approximately between the spindles 34 and 36. While a scanning heat source may increase the total time required to form a layer on the substrate 10, a scanning heat source may advantageously reduce excessive heating of the substrate surface and any attendant undesirable crystallization or aggregation of the layer 23d being formed on the substrate. Using a metal foil support as the donor support affords direct heating of the foil by applying a source of electrical potential between points or zones extending along the support when the donor support with the donor coating is in transferable relationship with the substrate. For example, if each of the spindles 34 and 36 are electrically conductive but electrically insulated from other members of the arrangement in FIG. 2A, an electrical potential can be applied between the spindles so as to cause an electrical current to flow in the electrically conductive web portion between the spindles and to provide resultant Joule heating of the donor web.

Figure 2B:
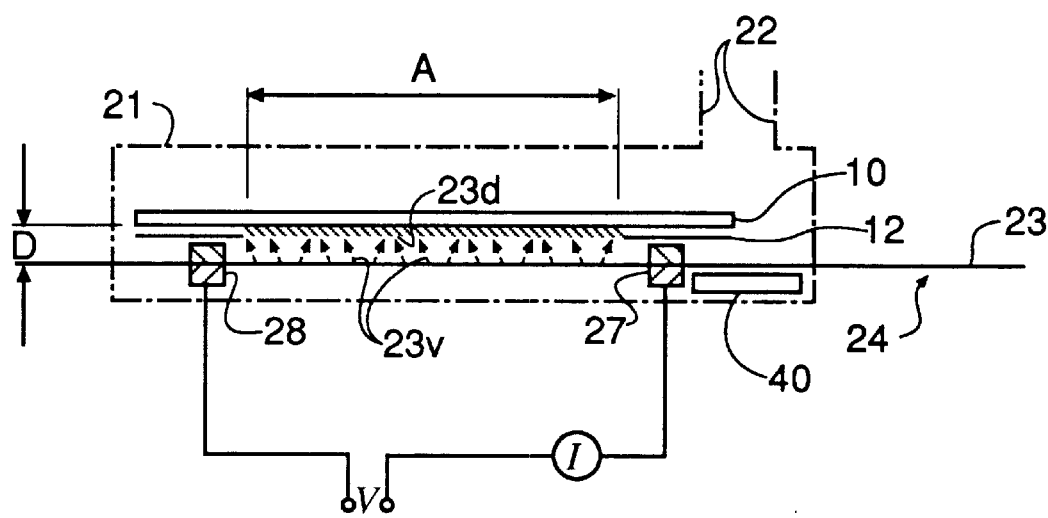
FIG. 2B depicts, in schematic form, an arrangement for depositing organic layers in light emitting devices by Joule heating of a conductive donor support in accordance with the present invention.

Referring now to FIG. 2B, there in shown, in schematic form, an arrangement for depositing organic layers in light emitting organic devices, in which an electrically conductive donor support 24 (for example, a metal foil support) with organic donor coating 23 is heated directly by Joule heating through application of an electrical voltage V between contact clamps 27 and 28 which contact the donor support 24. An ammeter I is used to monitor the electrical current flowing through the support 24, and temperature sensors (not shown) can be installed to measure the temperature of the donor support 24. All other numerals and designations refer to like parts and functions as described with reference to FIG. 2A.

The aperture mask 12 is conveniently fabricated from a metallic foil or sheet by micromachining methods well known in this art. Such micromachining methods are capable of rendering apertures which can be as small as a few micrometers in dimension and, if the aperture mask 12 is to contain a plurality of apertures, the distance between adjacent apertures can also be as small as a few micrometers.

Figure 3:
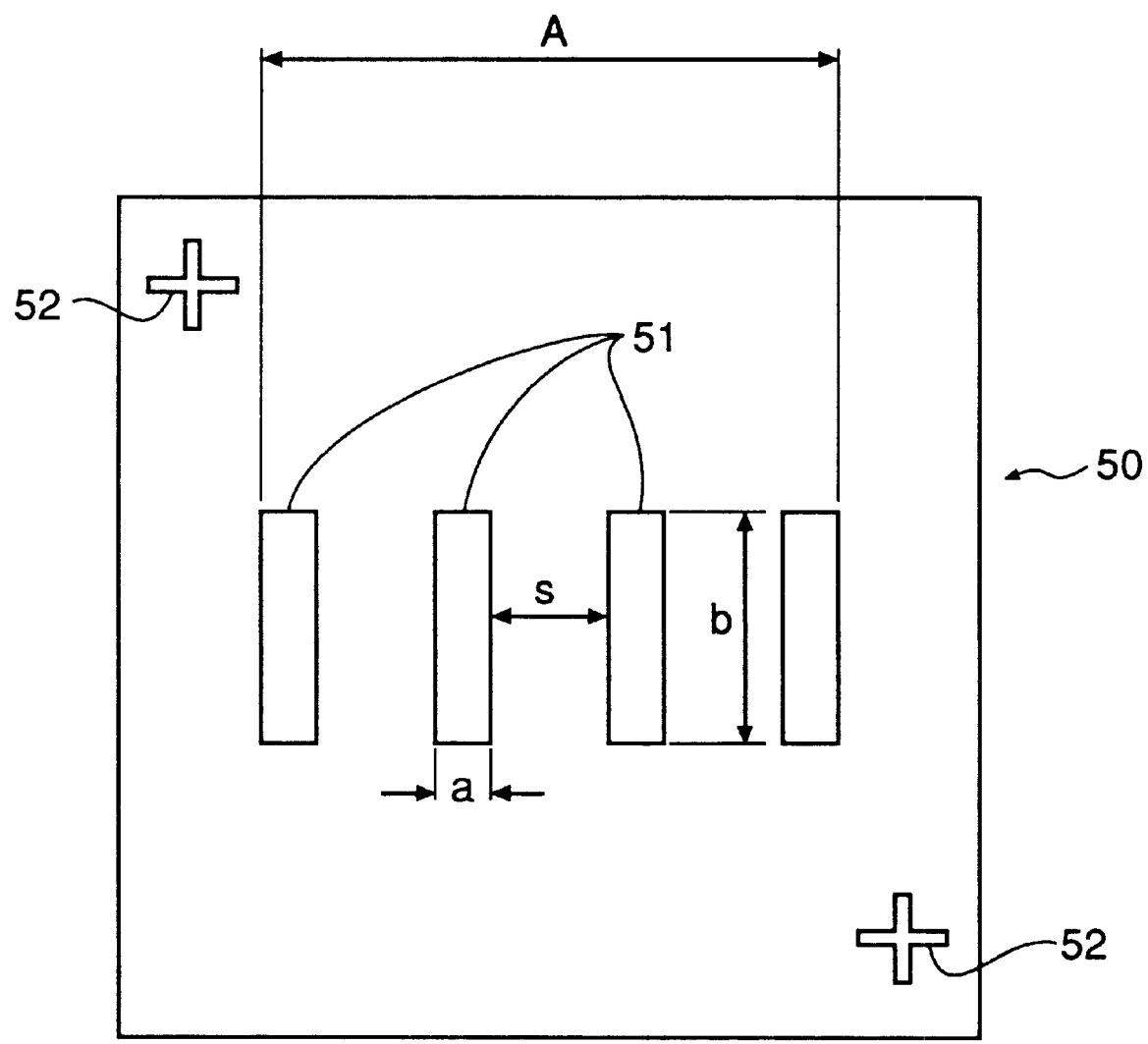
FIG. 3 shows, as an illustrative example, an aperture mask in plan view with a plurality of apertures and orientation marks.

Referring now to FIG. 3, there is depicted a schematic plan view of an illustrative example of an aperture mask 50 useful in the practice of the invention. The mask has a plurality of apertures 51, shown here as each aperture 51 being of equal dimensions a and b. The sum of all apertures dimensions and all spacings between apertures is designated as A to represent the same dimension A as in FIGS. 1, 2A and 2B.

Also provided are orientation marks 52, sometimes referred to as alignment targets. Orientation marks 52 can be apertures through which a directed beam of light can pass, or they can be opaque in appearance. In any event, the orientation marks 52 on the aperture mask 50 are used to position the aperture mask 50 in an oriented relationship with the substrate 10, which has a spatially matching or coincident set of orientation marks (not shown). Aperture masks defining particular aperture patterns are advantageously used in the practice of the invention when an organic layer is to be formed in correspondence with a particular aperture pattern.

The organic materials used in the method of making organic layers in organic light emitting devices in accordance with this invention can take any of the forms, such as those disclosed in the following commonly assigned: Tang U.S. Pat. No. 4,356,429; VanSlyke et al U.S. Pat. No. 4,539,507; VanSlyke et al U.S. Pat. No. 4,720,432; Tang et al U.S. Pat. No. 4,885,211; Tang et al U.S. Pat. No. 4,769,292; Littman et al U.S. Pat. No. 5,059,861; VanSlyke U.S. Pat. No. 5,047,687; VanSlyke et al U.S. Pat. No. 5,059,862;

VanSlyke et al U.S. Pat. No. 5,061,617; and Tang et al U.S. Pat. No. 5,294,870; the disclosures of which are here incorporated by reference.

In fabricating efficient organic light emitting devices it is known that depositing a plurality of organic layers on a substrate is advantageous. Tang et al U.S. Pat. No. 5,294,870, cited above shows in FIG. 7 a plurality of organic layers HI, HT, LU, EI which, together, are referred to as an organic electroluminescent (EL) medium being disposed between electrodes E1 and E2. These organic layers are vapor-deposited, thin films comprising in sequence a hole injecting (HI) layer, a hole transporting (HT) layer, a luminescent (LU) layer, and an electron injecting (EI) layer. The luminescent layer LU will be referred to here as the light emitting layer.

The method in accordance with the present invention is particularly advantageous in forming the above-mentioned sequence of organic layers on a substrate. For example, the donor support can be precoated in segments extending along the support in the support transport direction, with segments arranged in spatial sequence to provide a transferable coating of organic donor material of HI, HT, LU, and EI in this spatial sequence. Each segment of the donor support is then sequentially positioned in transferable relationship with the substrate in an environment of reduced pressure, followed by heating the respective segment of the donor support to cause the respective segment of transferable coating of organic donor material to transfer to a position on or over the substrate and to form a layer thereon.

Alternatively, a plurality of donor supply rolls or sheets are prepared by precoating each one with a transferable coating of a particular composition of organic donor material, such as one of the aforementioned materials HI or HT or LU or EI. Each of these donors is then used in an arrangement dedicated for depositing an organic layer of that particular composition.

Numerous organic materials, disclosed in the above-cited references, can be useful to form the layers HI, HT, LU, and EI on a substrate in accordance with the present invention. Selection of particular organic materials is influenced, among other considerations, by their ability to provide uniform transferable donor coatings on a donor support, and by their ability to maintain transferable properties during a storage interval between preparation of a coating on the donor support and its deployment in the heat transfer step.

With reference to the light emitting layer, the light emitting properties of an organic light emitting device can be improved if the light emitting layer contains at least one highly fluorescent organic material. Following the teachings of Tang et al U.S. Pat. No. 4,769,292, cited above, the present invention contemplates precoating a donor support with an organic transferable donor composition comprising an organic light emitting material and one or more highly fluorescent organic materials and transferring the materials of this composition to form a light emitting layer with improved light emitting properties on a substrate. In the practice of the invention the highly fluorescent organic materials are selected, in one aspect, to transfer from the donor coating on the donor support together with the light emitting material so as to provide a light emitting layer on the substrate which has a desired composition of light emitting and highly fluorescent organic materials and thus having the desired improved light emitting properties.

EXAMPLES

Example 1

This example describes the pre-coating of a metal foil donor sheet with an organic hole transporting donor material (NPB), and the transfer of the donor coating to form a layer on a silicon substrate.

The donor sheet was a 0.005 inch tantalum sheet. The donor sheet was then coated with approximately 1000 Å of NPB (4,4'-bis-[N-(1-naphthyl)-N-phenylamino]-bi-phenyl) using standard thermal evaporation at $1*10^{-5}$ Torr from a graphite source at a source to sheet distance of approximately 11–12 inches. A bare silicon wafer was then positioned as a substrate about 1 cm from the NPB coated surface of the donor sheet, which was resistively heated with a current of approximately 40 amps for 1.5–2 minutes. This produced a temperature of 207° C. at the donor sheet which was sufficiently high for complete transfer of the NPB from the donor sheet to the silicon substrate. The donor sheet was then removed and inspected under UV light. No fluorescence was observed, indicating complete transfer of the organic material.

A uniform layer of NPB was formed over the surface of the silicon substrate. The thickness of the layer was 540 Å, and the layer was formed over a substrate area of approximately 10 cm$^2$ due to the non-directional transfer of material from the donor sheet to the substrate (no aperture mask was used adjacent to the substrate during the transfer).

Example 2

This example describes the pre-coating of a metal foil donor sheet with an organic light emitting donor material (AlQ), and the transfer of the donor coating to form a layer on a silicon substrate.

The experiment in Example #1 was repeated except 1000 Å of AlQ (Tris(8-quinolinolato-Nl,O8)-aluminum) was coated onto the donor sheet. A bare silicon wafer was then positioned as a substrate about 1 cm from the AlQ coated surface of the donor sheet, which was resistively heated with a current of approximately 40 amps for 1.5–2 minutes. This produced a donor sheet temperature of 222° C. which was sufficiently high for complete transfer of the AlQ from the donor sheet to the substrate.

A uniform layer of AlQ was formed over the surface of the silicon substrate. The thickness of the layer was 570 Å, and the layer was formed over a substrate area of approximately 10 c$^{m2}$ due to the non-directional transfer of material from the donor sheet to the substrate.

Example 3

Figure 1:
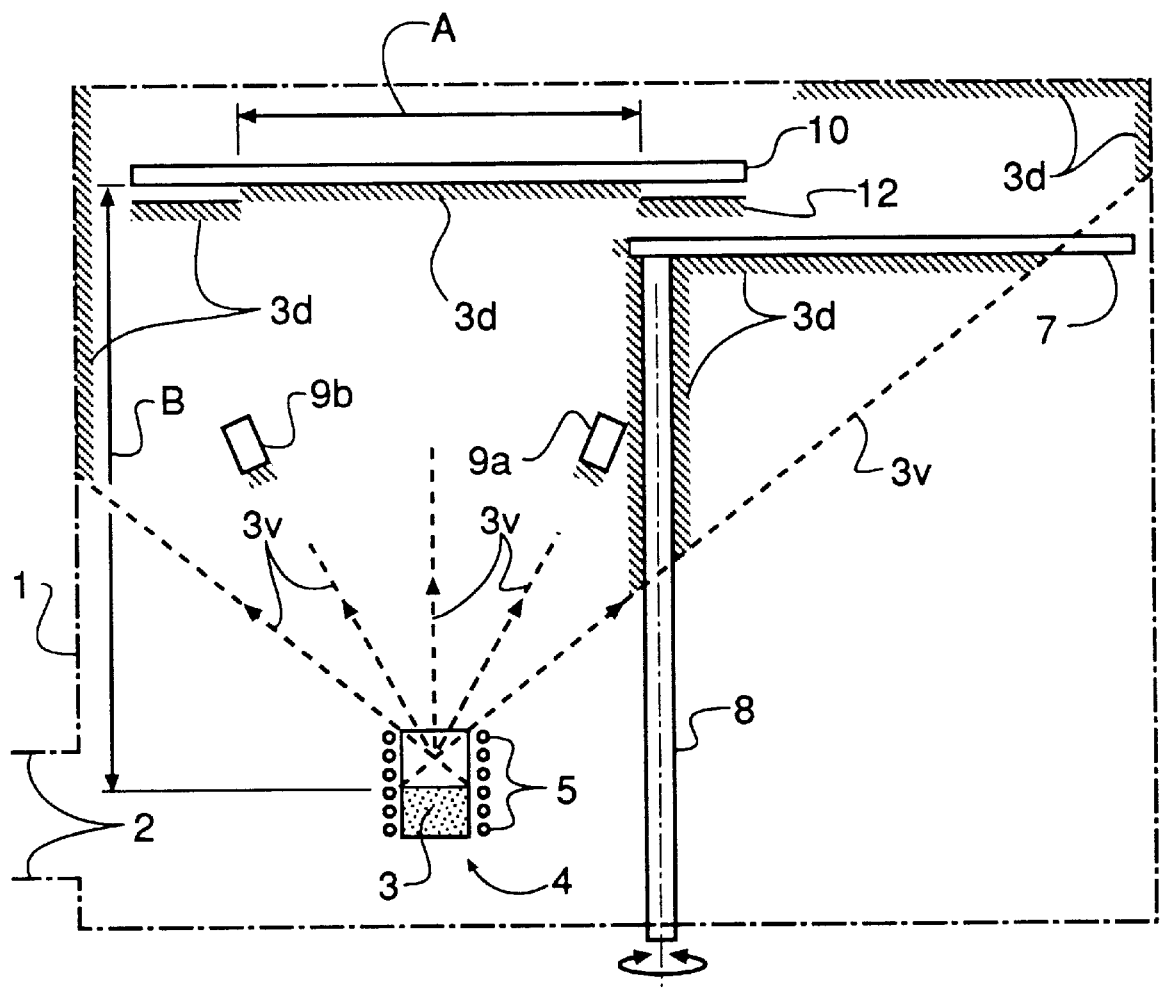
FIG. 1 shows schematically a prior art arrangement for depositing organic layers useful in organic light emitting devices.

This examples describes the fabrication of two-layer organic light emitting devices by the prior art method of forming organic layers (see FIG. 1).

An ITO coated glass substrate was rigorously cleaned by scrubbing followed by a two minute oxygen plasma treatment at (500 mTorr oxygen and 500 watts RF). The glass substrate was then loaded into a vacuum deposition system which was evacuated to about $1*10^{-5}$ Torr before deposition of the organic layers.

Organic layer #1

A 600 Å NPB hole transporting layer was deposited onto the ITO coated glass by standard thermal deposition from a graphite source. The graphite source temperature was controlled at 285° C. which resulted in a deposition rate of 5–7 Å/s. The source to substrate distance was about 25 cm.

Organic Layer #2

A 750 Å AlQ light emitting layer was deposited by standard thermal deposition from a graphite source. The temperature of the graphite source was controlled at 320° C. which resulted in a deposition rate of 4–5 Å/s. The source to substrate distance was about 25 cm.

Metal Layer

The vacuum system was then vented and the substrates were aligned to an aperture mask used to define the electrode area. The vacuum system was pumped down to 1*10–5 and a 2000 Å magnesium: silver cathode was deposited over layer 2 through the apertures in the mask using standard thermal evaporation from two independently controlled sources. The ratio of Mg to Ag is 10:1 by volume. The source to substrate distance was about 300 cm.

Example 4a

This example describes the fabrication of two-layer organic light emitting devices by the inventive method of forming organic layers.

An ITO coated glass substrate was cleaned as detailed in Example 3.

A donor sheet of the hole transporting donor material (NPB) was prepared as described in Example 1. The thickness of NPB deposited onto the donor sheet was 1000 Å. The ITO coated substrate was positioned under the donor sheet, and the NPB was then transferred to the ITO substrate as described in Example 1. The substrate was then moved, and a 1000 Å AlQ donor sheet was prepared as described in Example 2 The substrate was repositioned under the donor sheet, and the AlQ coating was then transferred as described in Example 2, to form a light emitting layer on the substrate. A magnesium:silver cathode was deposited over the AlQ layer by the method described in Example 3.

Example 4b

Example 4a was repeated, except that a coating of 1300 Å thickness of NPB was prepared as the hole transporting donor material, and a coating of 1300 Å thickness of AlQ was prepared as the light emitting donor material.

Example 4c

Example 4a was repeated, except that a coating of 1600 Å thickness of NPB was prepared as the hole transporting donor material, and a coating of 1600 Å thickness of AlQ was prepared as the light emitting donor material.

Table 1

Table 1 summarizes, for the two-layer light emitting devices of Examples 3 and 4a–c, the coating thickness values of the respective donor coatings and the layer thickness values of the respective layers formed on the substrates. Also provided are measures of operating performance of the devices at an operating current density of 20 mA/cm$^2$: the operating voltage applied to each device to obtain the stated current density, and an indicator of the efficiency of light emission expressed in terms of light output in Watt (W)/ current flowing through the device in Amperes (A).

It is apparent from the above data that the operating performance of the devices of Examples 4a–c, prepared by the method in accordance with the present invention, is comparable to the operating performance of the device of Example 3 which was prepared by the prior art method.

The invention has been described in detail, with particular reference to certain preferred embodiments thereof, but it will be understood that variations and modifications can be effected within the spirit and scope of the invention.

| Parts List | |
|---|---|
| 1 | reduced pressure chamber (prior art) |
| 2 | pump port |
| 3 | organic material |
| 3v | vapor of organic material |
| 3d | deposited layers |
| 4 | source crucible |
| 5 | heating coils |
| 7 | shutter blade |
| 8 | shutter shaft |
| 9a | deposition monitor |
| 9b | deposition monitor |
| 10 | substrate |
| 12 | aperture mask (single aperture A) |
| 21 | reduced pressure chamber |
| 22 | pump port |
| 23 | coating of organic donor material |
| 23v | donor vapor |
| 23d | deposited donor layer |
| 24 | donor support |
| 25 | heating elements |
| 27 | contact clamp |
| 28 | contact clamp |
| 30 | donor supply roll |
| 32 | donor return roll |
| 34 | spindle |
| 36 | spindle |
| 40 | heating station |
| 50 | aperture mask (plurality of apertures) |
| 51 | apertures |
| 52 | orientation marks |

We claim:

1. A method of making an organic light emitting device which has a plurality of layers on a substrate, comprising:

a) providing a substrate which has orientation marks;

b) providing a transferable coating of an organic donor material on a donor support;

c) positioning an aperture mask defining an aperture pattern adjacent to the substrate in oriented relationship with the orientation marks;

d) positioning the coating on the donor support a predetermined distance spaced from the substrate in an environment of reduced pressure having a mean free path at least equal to the predetermined distance; and e) heating the donor support to cause the organic donor material to form vapor molecules which transfer to

TABLE 1

| Example | NPB Thickness Å (Donor Sheet) | NPB Thickness Å (ITO Substrate) | AlQ Thickness Å (Donor Sheet) | AlQ Thickness Å(ITO Substrate) | Voltage at 20 mA/cm$^2$ | Efficiency (W/A) |
|---|---|---|---|---|---|---|
| 3 | NA | 600 | NA | 750 | 8.7 | 0.027 |
| 4a | 1000 | 550 | 1000 | 580 | 9.1 | 0.029 |
| 4b | 1300 | 700 | 1300 | 750 | 8.5 | 0.029 |
| 4c | 1600 | 850 | 1600 | 900 | 8.0 | 0.023 | form a uniform deposited layer on the substrate in areas delineated by the aperture mask.

2. A method as claimed in claim 1, wherein the organic donor material is a hole injecting layer.

3. A method as claimed in claim 1, wherein the organic donor material is a hole transporting layer.

4. A method as claimed in claim 1, wherein the organic donor material is a light emitting layer.

5. A method as claimed in claim 1, wherein the organic donor material is a electron transporting layer.

6. A method as claimed in claim 1, wherein the reduced pressure is less than 0.01 Torr.

7. A method as claimed in claim 1, wherein the reduced pressure is less than 1 Torr.

8. A method as claimed in claim 6, wherein the predetermined distance is from about 0.2 cm to about 2 cm.

9. A method as claimed in claim 7, wherein the predetermined distance is from about 0.2 cm to about 2 cm.

10. A method as claimed in claim 1, wherein the donor support is a metal foil.

11. A method as claimed in claim 1, wherein the donor support is a plastic foil.

12. A method as claimed in claim 11, wherein the plastic foil is fiber-reinforced.

13. A method as claimed in claim 1, wherein the donor support is preheated prior to being positioned a predetermined distance from said substrate.

\* \* \* \* \*